US012158663B2

(12) United States Patent
Nagatani

(10) Patent No.: US 12,158,663 B2
(45) Date of Patent: Dec. 3, 2024

(54) LIGHT EMITTING DEVICE, DISPLAY, AND ELECTRONIC APPARATUS

(71) Applicant: SATURN LICENSING LLC, New York, NY (US)

(72) Inventor: Shinpei Nagatani, Kanagawa (JP)

(73) Assignee: SATURN LICENSING LLC, New York, NY (US)

( * ) Notice: Subject to any disclaimer, the term of this patent is extended or adjusted under 35 U.S.C. 154(b) by 0 days.

(21) Appl. No.: 18/380,715

(22) Filed: Oct. 17, 2023

(65) Prior Publication Data

US 2024/0111190 A1     Apr. 4, 2024

Related U.S. Application Data

(63) Continuation of application No. 17/441,878, filed as application No. PCT/JP2020/009761 on Mar. 6, 2020, now Pat. No. 11,841,587.

(30) Foreign Application Priority Data

Mar. 29, 2019    (JP) .................................. 2019066654

(51) Int. Cl.
*G02F 1/1335*     (2006.01)
*C09K 11/61*     (2006.01)
(Continued)

(52) U.S. Cl.
CPC ...... *G02F 1/133622* (2021.01); *C09K 11/617* (2013.01); *C09K 11/646* (2013.01);
(Continued)

(58) Field of Classification Search
CPC . C09K 11/7774; C09K 11/646; C09K 11/617; H05B 45/20; G09G 3/3426;
(Continued)

(56) References Cited

U.S. PATENT DOCUMENTS 7,002,546 B1    2/2006   Stuppi et al.
7,336,325 B2    2/2008   Hong et al.
(Continued)

FOREIGN PATENT DOCUMENTS

CN     104009029     8/2014
CN     104781942     7/2015
(Continued)

OTHER PUBLICATIONS

International Search Report for PCT/JP2020/009761 mailed Apr. 21, 2020; 2 pages.

*Primary Examiner* — Vinh T Lam
(74) *Attorney, Agent, or Firm* — Richard LaPeruta

(57) ABSTRACT

To provide a light emitting device that is used for a display that is able to display an image having a wider color gamut. This light emitting device includes: a first light source configured to perform an operation of blinking first emission light including first blue light and first red light; and a second light source configured to perform an operation of blinking second emission light independently of the operation of blinking the first emission light by the first light source. The second emission light includes second red light and green light.

20 Claims, 18 Drawing Sheets

(51) Int. Cl.
  *C09K 11/64* (2006.01)
  *C09K 11/77* (2006.01)
  *G02F 1/13357* (2006.01)
  *G09G 3/34* (2006.01)
  *G09G 3/36* (2006.01)
  *H01L 25/13* (2006.01)
  *H01L 33/50* (2010.01)
  *H01L 33/60* (2010.01)

(52) U.S. Cl.
  CPC .... *C09K 11/7774* (2013.01); *G02F 1/133603* (2013.01); *G02F 1/133614* (2021.01); *G09G 3/3426* (2013.01); *H01L 25/13* (2013.01); *H01L 33/504* (2013.01); *H01L 33/60* (2013.01); *G09G 3/36* (2013.01); *G09G 2320/0233* (2013.01)

(58) Field of Classification Search
  CPC .. G09G 2320/0233; G09G 3/36; G02B 5/201; G02B 5/22; H01L 33/60; H01L 25/13; H01L 33/504; H01L 25/0753; H01L 33/50; G02F 1/133603; G02F 1/133622; G02F 1/133614
  See application file for complete search history.

(56) References Cited

U.S. PATENT DOCUMENTS

| | | | |
|---|---|---|---|
| 8,125,152 B2 | 2/2012 | Fujiwara et al. | |
| 8,534,857 B2 | 9/2013 | Shimizu et al. | |
| 8,791,966 B2 | 7/2014 | Hayashi | |
| 9,491,828 B2 | 11/2016 | Negley et al. | |
| 9,564,557 B2 | 2/2017 | Weiler et al. | |
| 9,574,723 B2 | 2/2017 | Baumgartner et al. | |
| 9,750,105 B2 * | 8/2017 | Rantala | H05B 45/20 |
| 9,921,428 B2 | 3/2018 | Van et al. | |
| 10,158,052 B2 | 12/2018 | Weiler et al. | |
| 10,210,820 B2 | 2/2019 | Inamura et al. | |
| 10,236,423 B2 * | 3/2019 | Takehara | H01L 25/0753 |
| 10,317,728 B2 | 6/2019 | Aijichi et al. | |
| 10,443,818 B2 | 10/2019 | Ninan et al. | |
| 10,462,872 B1 | 10/2019 | Lin et al. | |
| 10,479,932 B2 * | 11/2019 | Moon | H01L 33/48 |
| 10,833,227 B2 | 11/2020 | Vampola et al. | |
| 10,907,786 B2 | 2/2021 | Chen | |
| 10,910,526 B2 | 2/2021 | Amiya et al. | |
| 10,993,571 B2 | 5/2021 | Loomis | |
| 11,024,667 B2 * | 6/2021 | Miki | H01L 33/62 |
| 11,071,177 B2 * | 7/2021 | Gordin | A61N 5/0618 |
| 11,084,980 B2 | 8/2021 | Hirosaki et al. | |
| 11,158,769 B2 | 10/2021 | Pust | |
| 11,195,483 B2 | 12/2021 | Ninan et al. | |
| 11,219,104 B2 * | 1/2022 | Medricky | H05B 47/16 |
| 11,244,929 B2 * | 2/2022 | Ueno | F21K 9/00 |
| 11,355,082 B2 | 6/2022 | Kawashima et al. | |
| 11,613,696 B2 | 3/2023 | Yamasuge et al. | |
| 11,788,690 B2 * | 10/2023 | Soer | F21V 7/22 257/89 |
| 11,841,587 B2 * | 12/2023 | Nagatani | G02F 1/133614 |
| 2006/0289880 A1 | 12/2006 | Kurihara | |
| 2009/0266977 A1 | 10/2009 | Kosht et al. | |
| 2011/0128466 A1 | 6/2011 | Ishii et al. | |
| 2011/0211336 A1 | 9/2011 | Oshio | |
| 2018/0074632 A1 | 3/2018 | Fong et al. | |
| 2018/0240937 A1 | 8/2018 | Park et al. | |
| 2019/0013444 A1 | 1/2019 | Morimoto et al. | |
| 2019/0071007 A1 | 3/2019 | Razafindrabeza et al. | |
| 2020/0098735 A1 | 3/2020 | Tada | |
| 2020/0269065 A1 | 8/2020 | Broeng et al. | |
| 2020/0270520 A1 | 8/2020 | Li | |
| 2020/0295237 A1 | 9/2020 | Lee et al. | |
| 2021/0062989 A1 | 3/2021 | Joe | |
| 2023/0411566 A1 * | 12/2023 | Zhang | H01L 33/504 |

FOREIGN PATENT DOCUMENTS

| | | |
|---|---|---|
| CN | 107250906 | 10/2017 |
| CN | 108352432 | 7/2018 |
| CN | 108681153 | 10/2018 |
| EP | 2645359 | 10/2013 |
| EP | 2915197 | 9/2015 |
| EP | 3343279 | 7/2018 |
| JP | 2007017781 | 1/2007 |
| JP | 2007042307 | 2/2007 |
| JP | 2007103965 | 4/2007 |
| JP | 2013205661 | 10/2013 |
| JP | 2015194636 | 11/2015 |
| JP | 2015233048 | 12/2015 |
| JP | 2016216711 | 12/2016 |
| JP | 2018101753 | 6/2018 |
| JP | 2018154706 | 10/2018 |
| JP | 2018164706 | 10/2018 |
| WO | 2009130816 | 10/2009 |
| WO | 2010023840 | 3/2010 |
| WO | 2016199544 | 12/2016 |
| WO | 2017188795 | 11/2017 |

* cited by examiner

[FIG. 1]
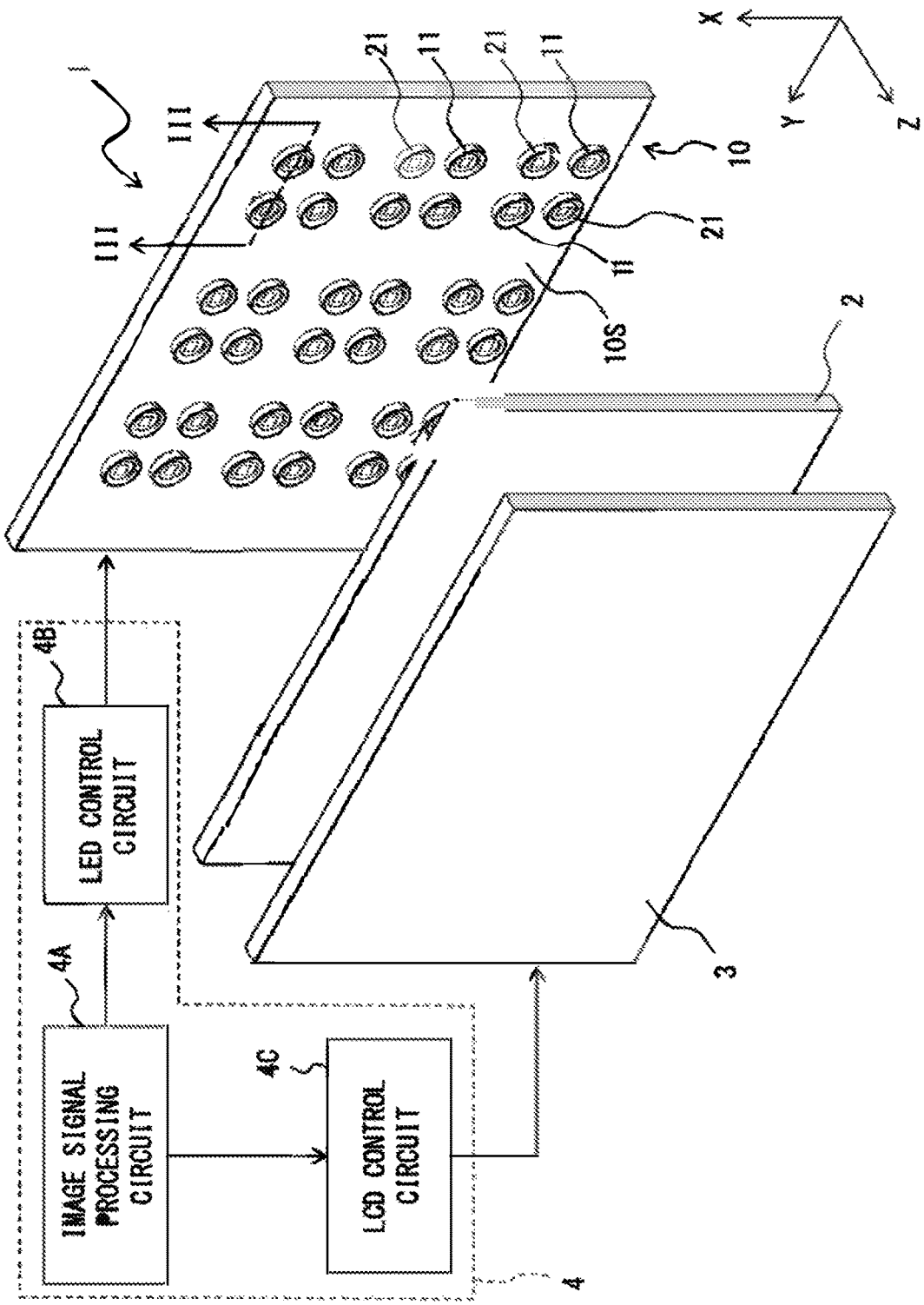

[FIG.2]
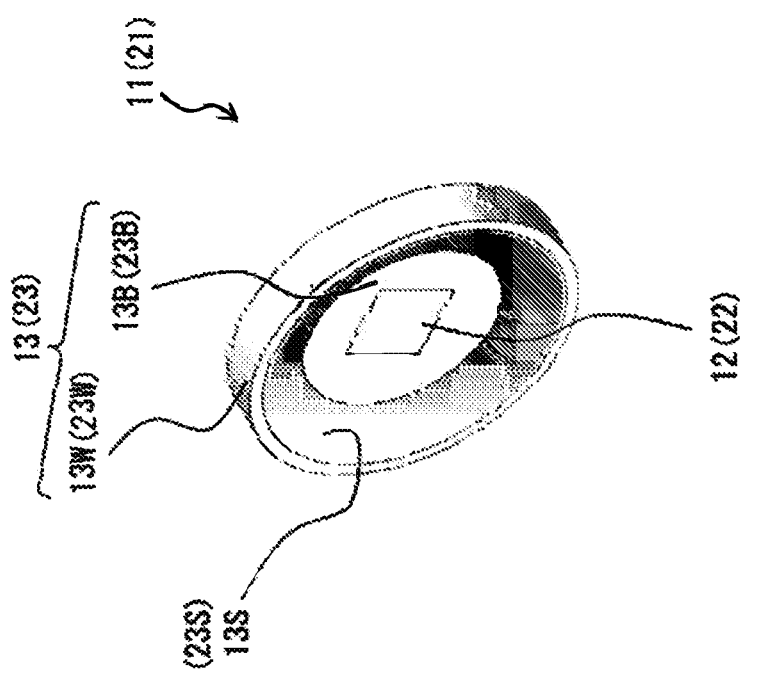

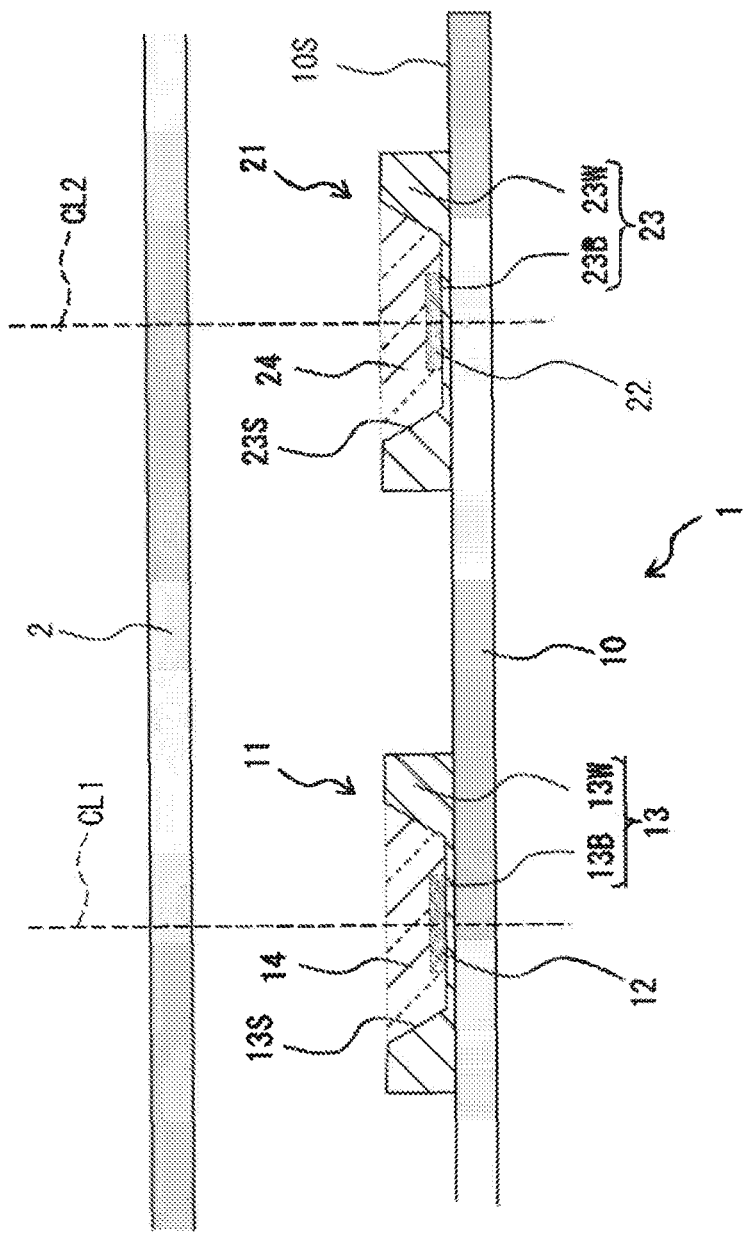

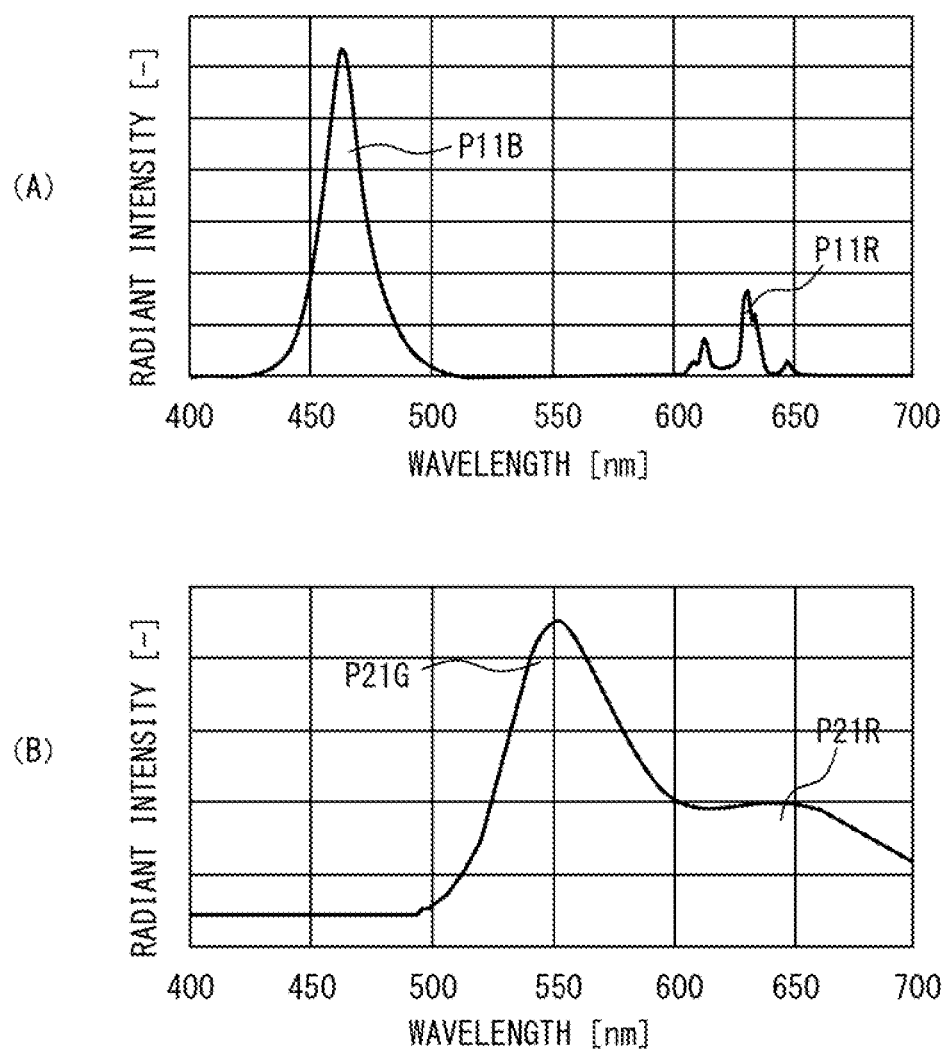

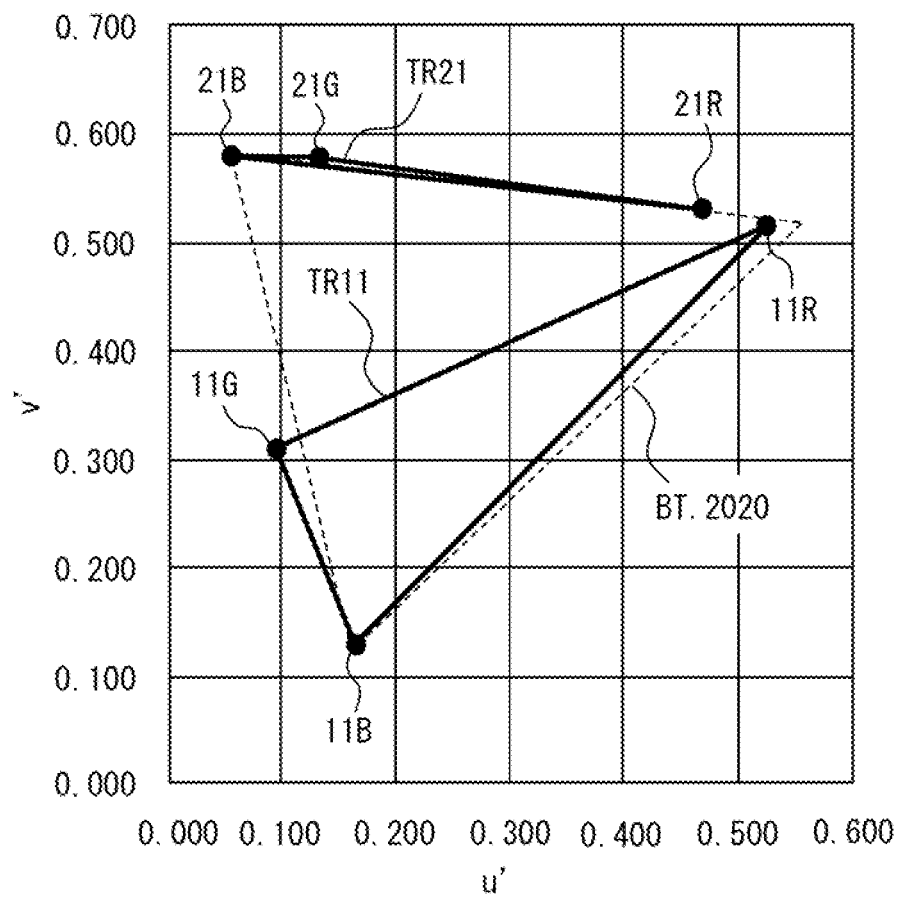
[FIG. 5]

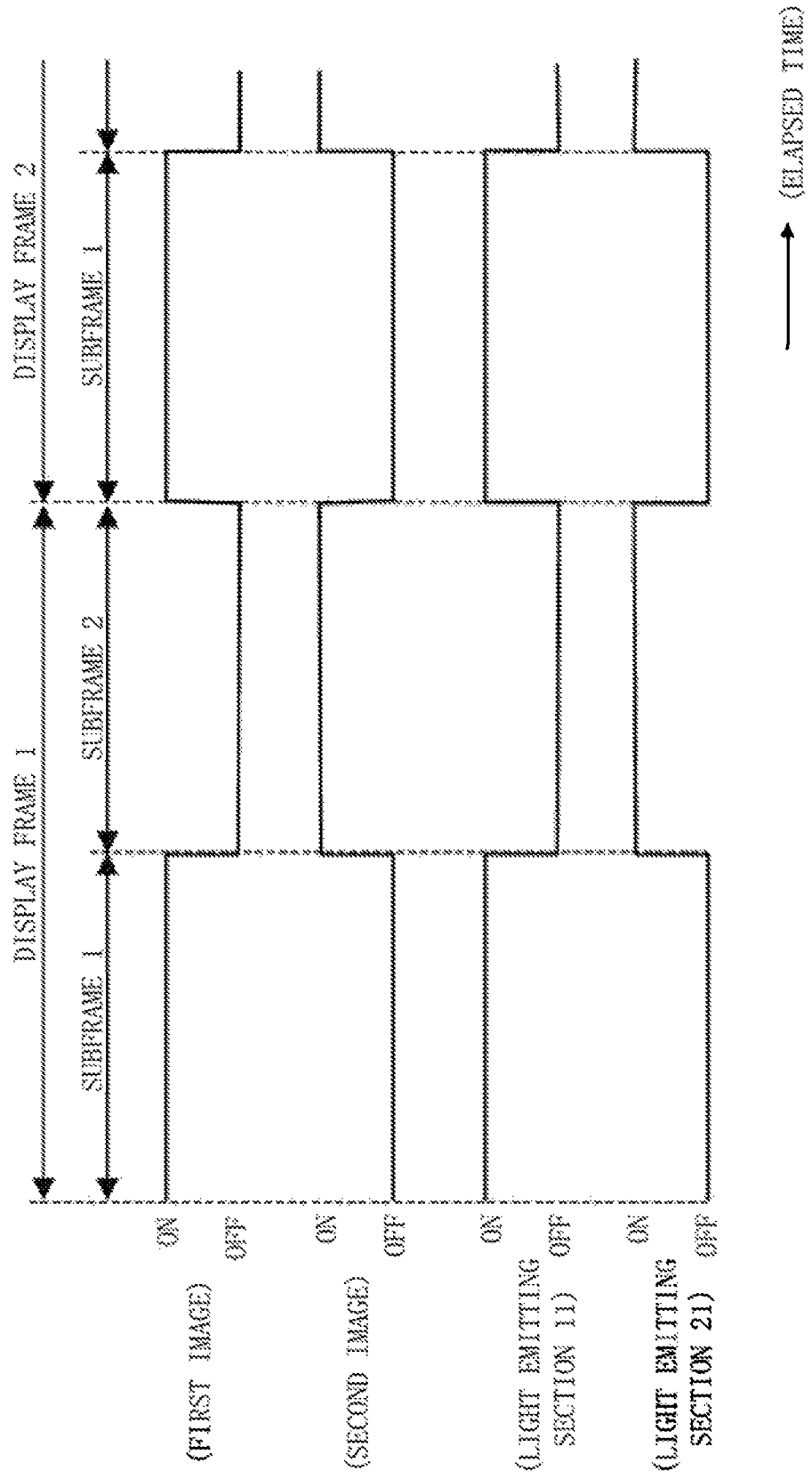

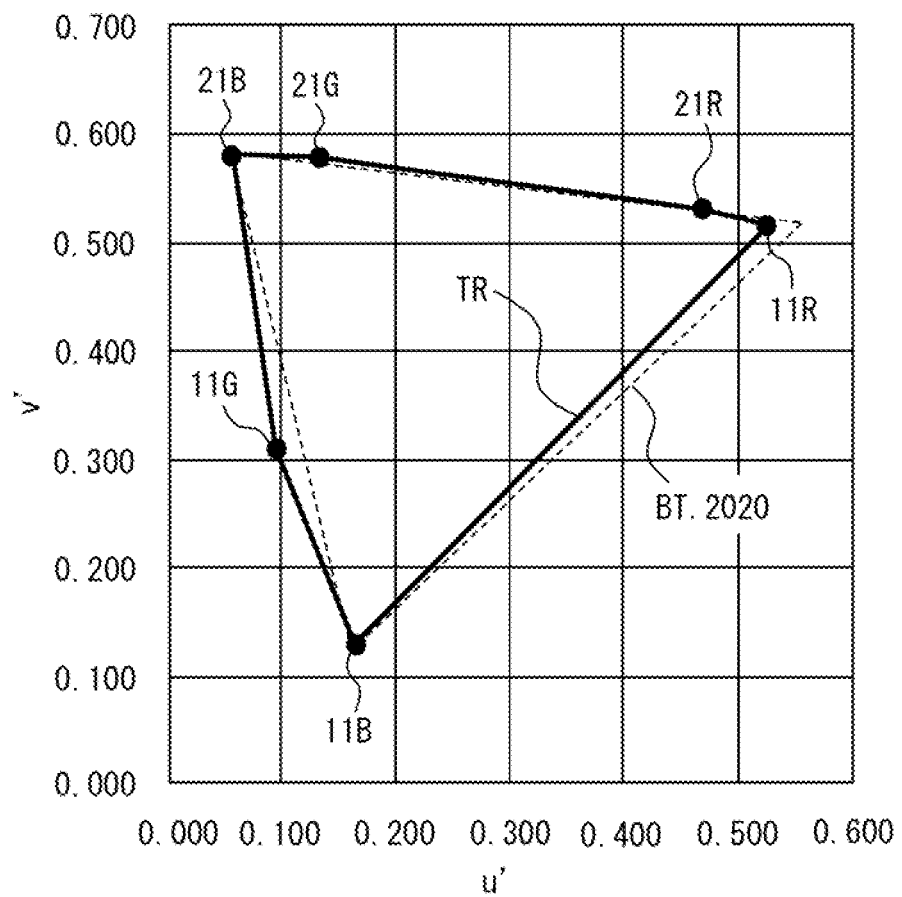
[FIG. 7]

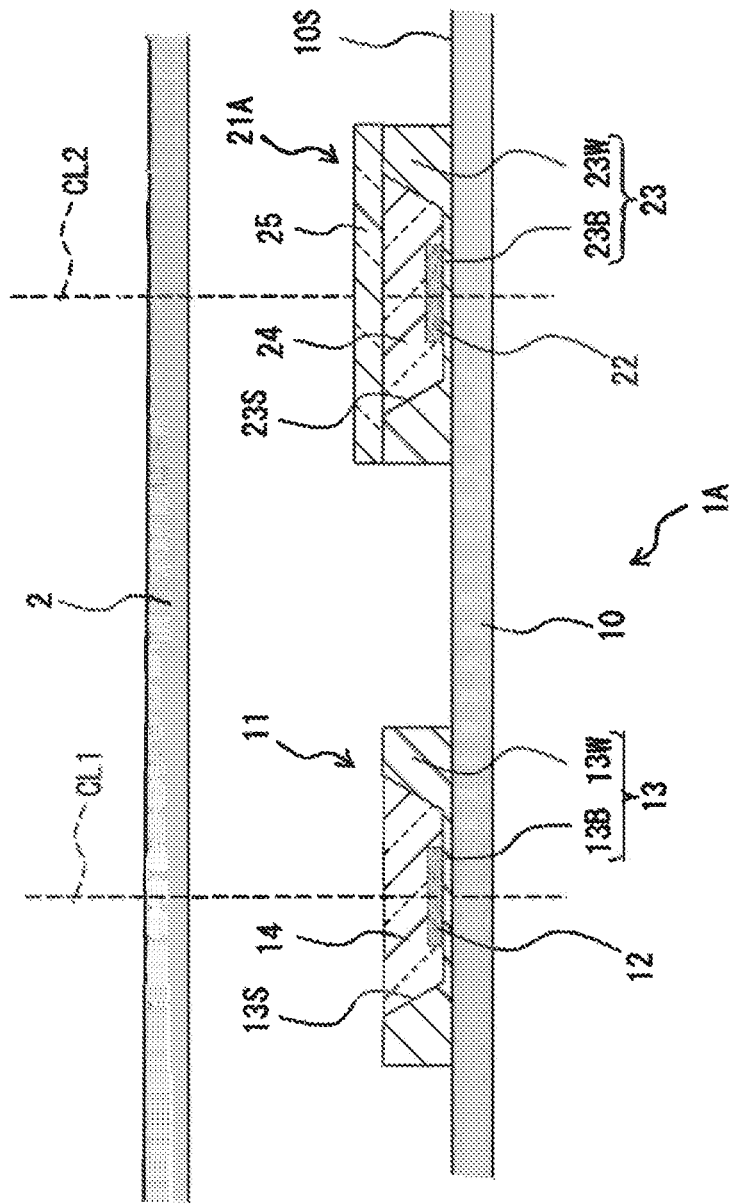

[FIG. 8B]
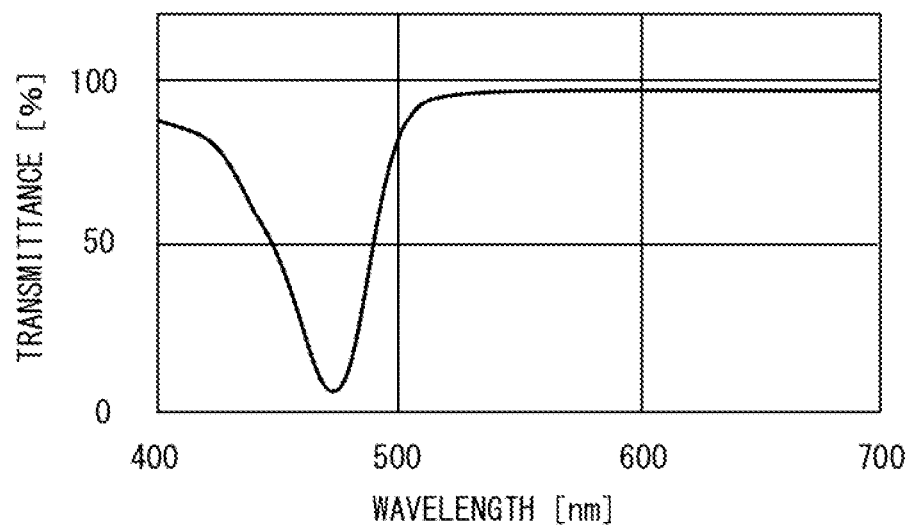

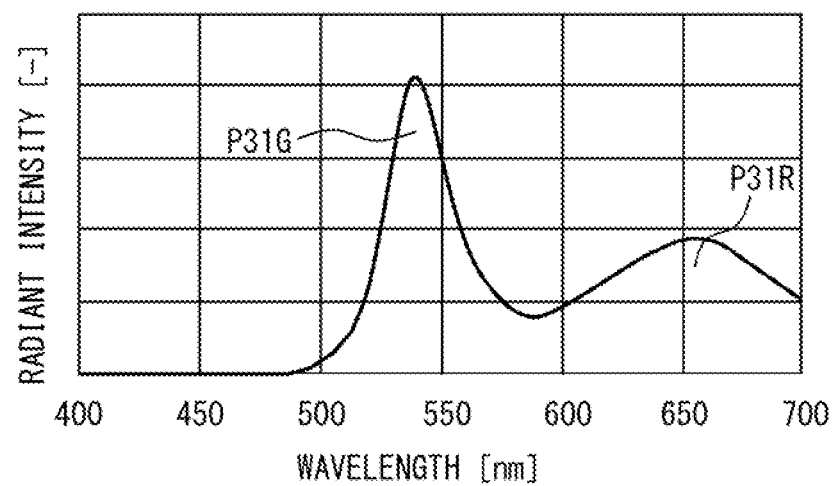
[ FIG. 10 ]

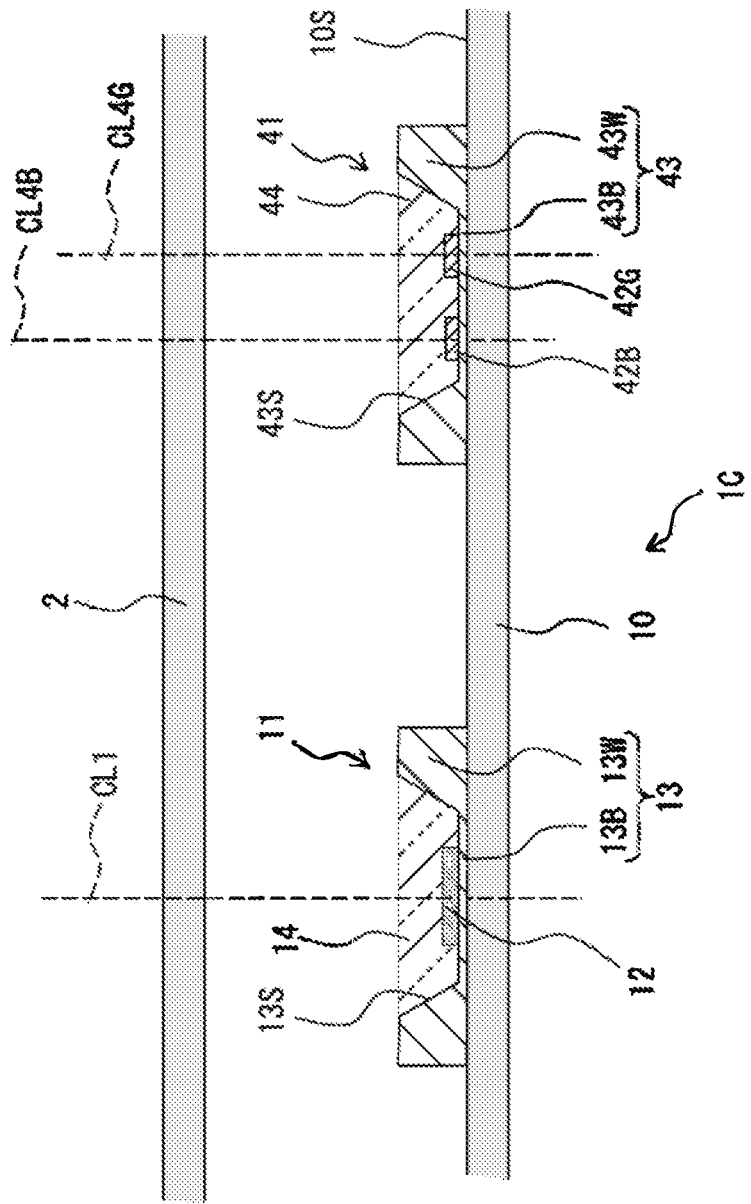
[FIG. 11]

[ FIG. 12A ]
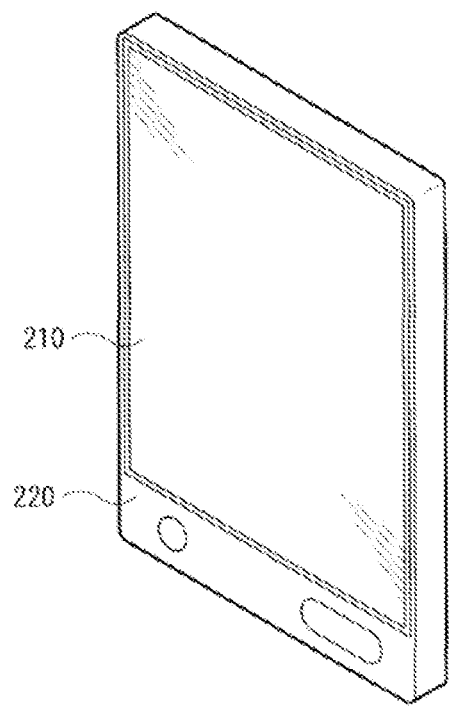
[ FIG. 12B ]
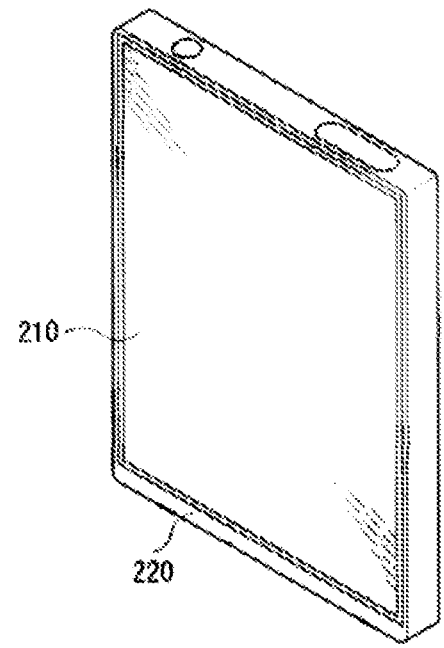

[ FIG. 13 ]
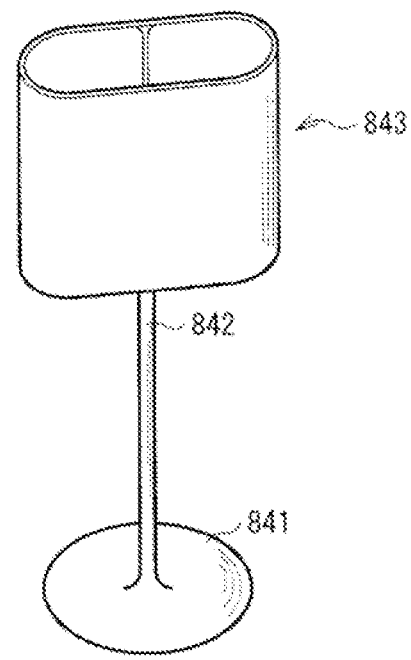
[ FIG. 14 ]
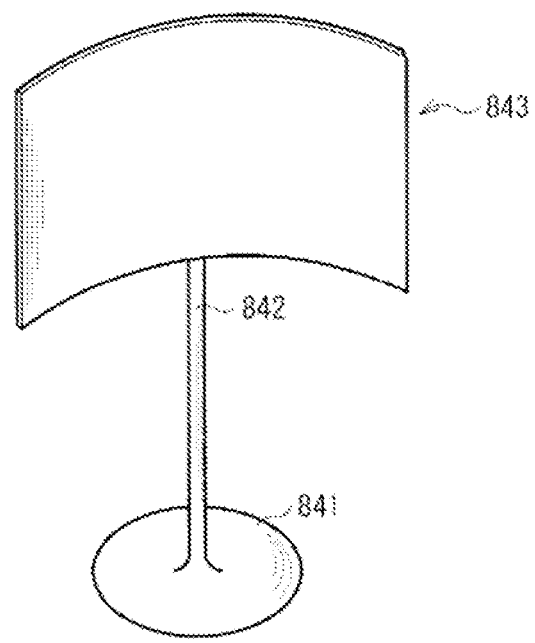

[FIG. 15]
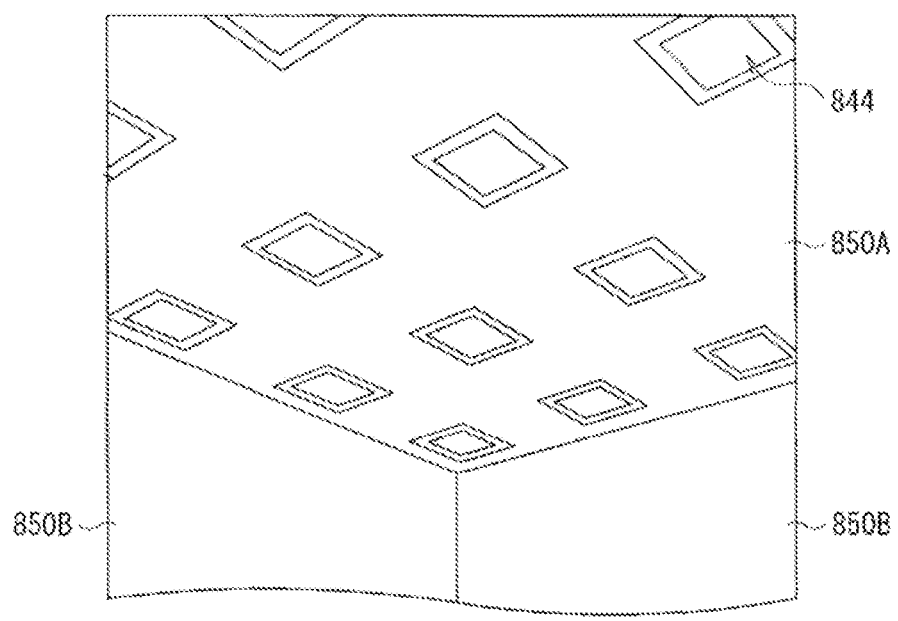

[FIG. 16A]
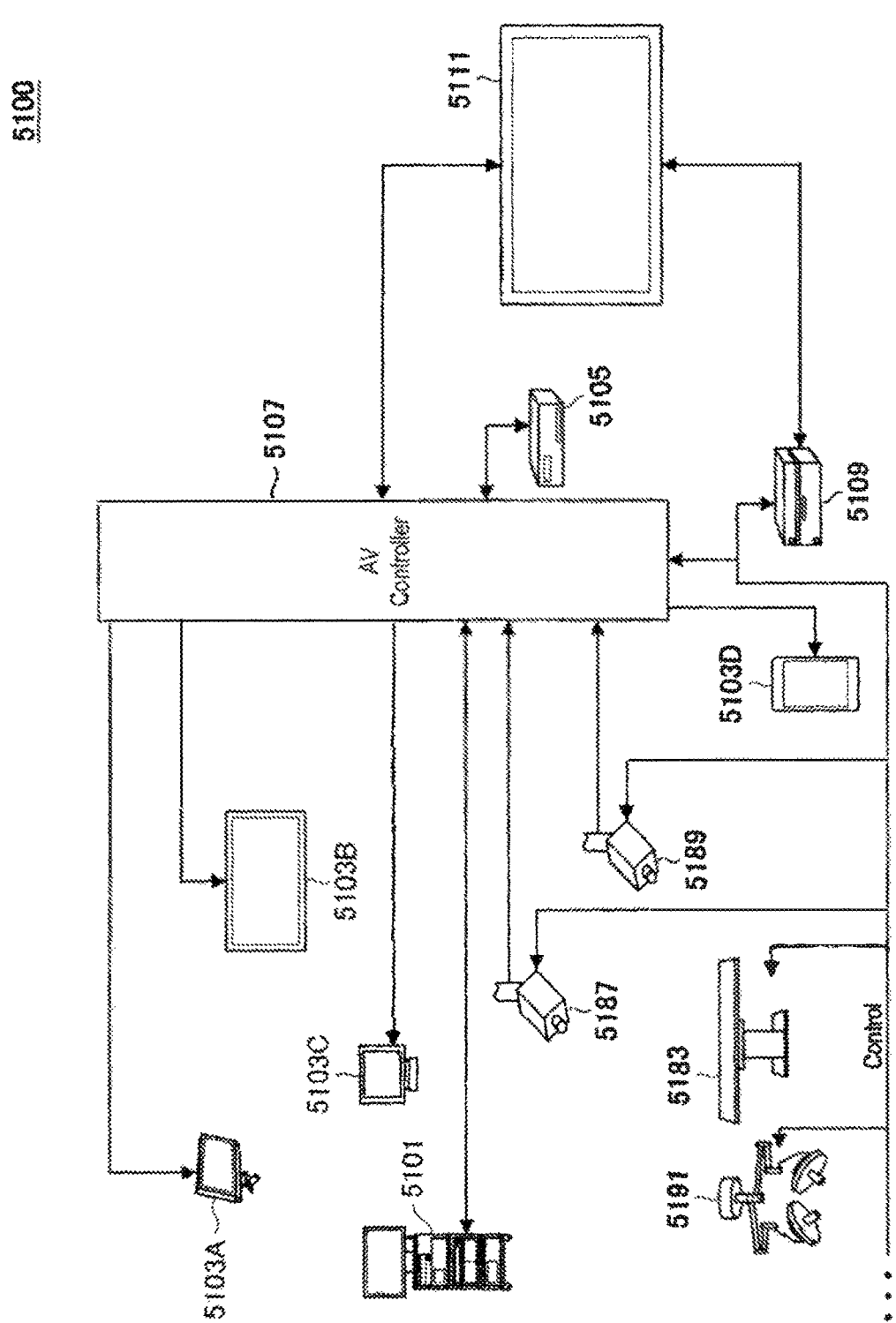

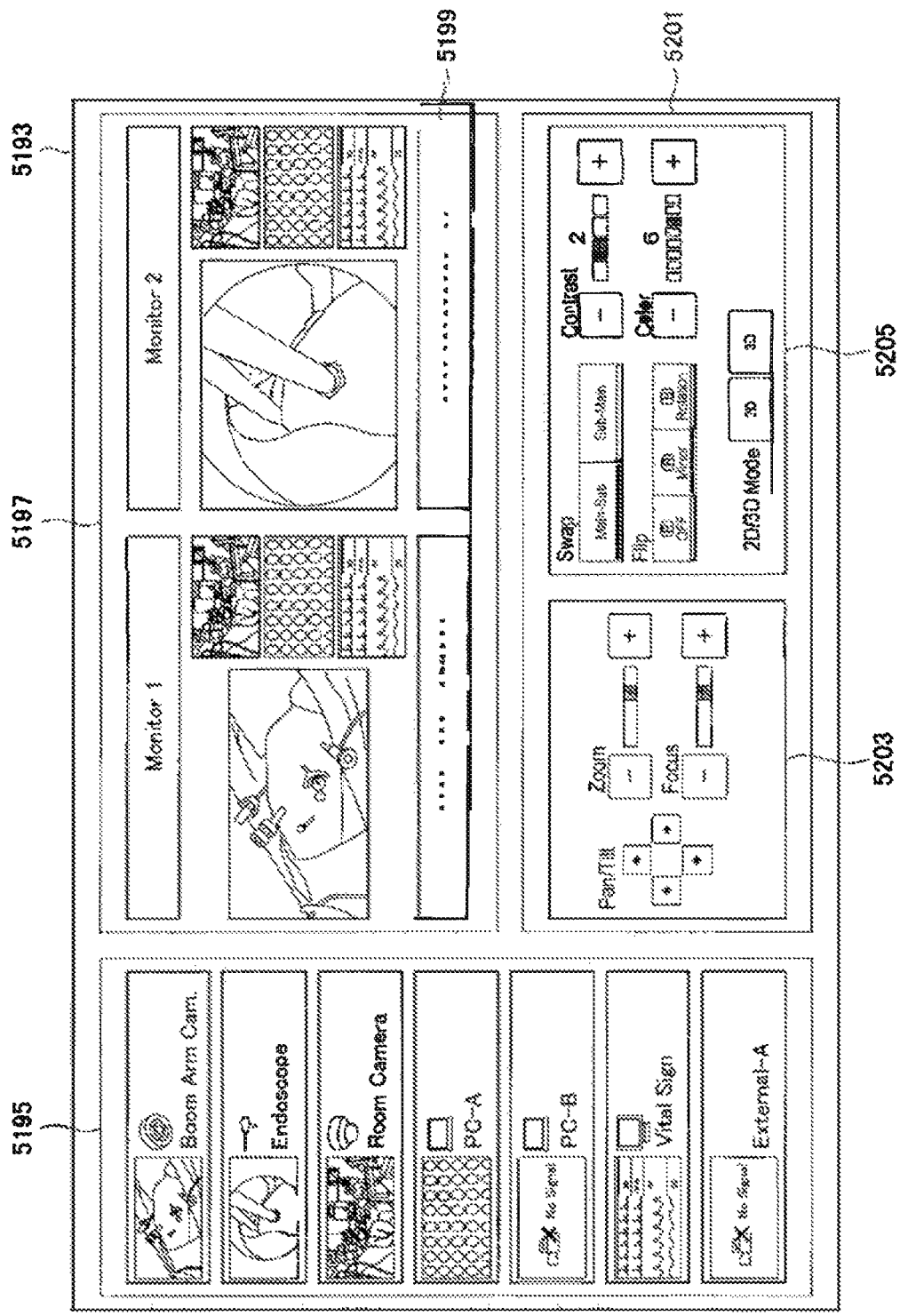
[FIG. 16B]

[ FIG. 17 ]
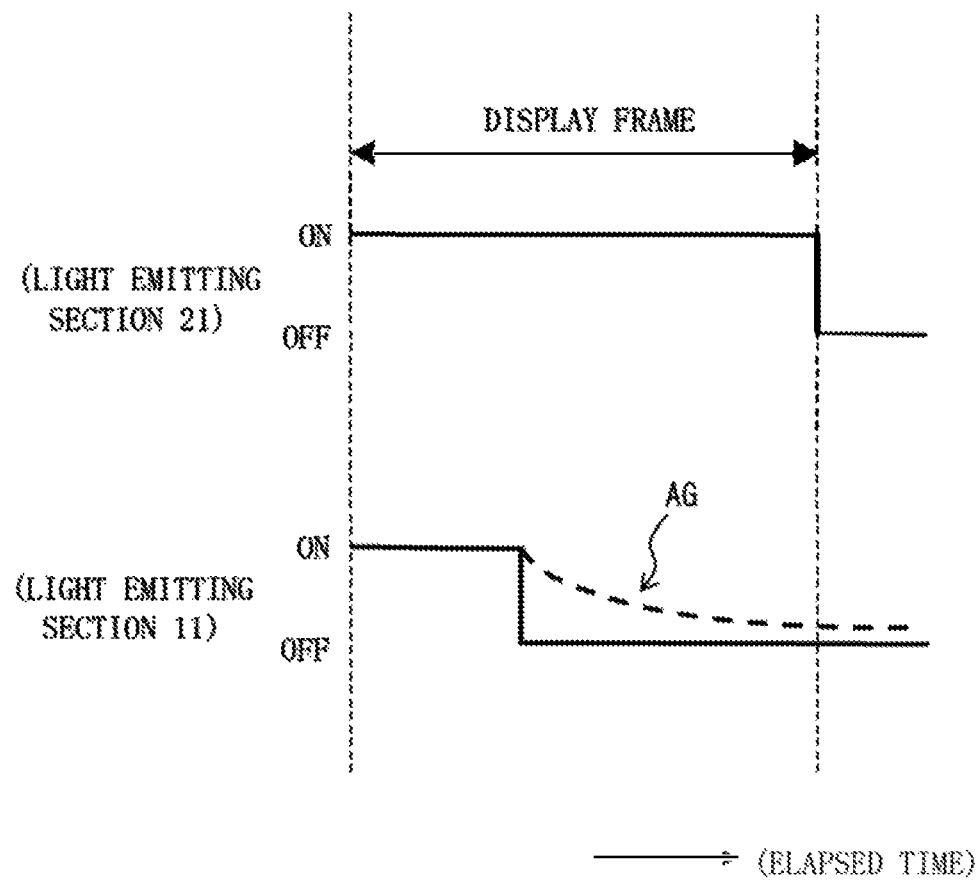

LIGHT EMITTING DEVICE, DISPLAY, AND ELECTRONIC APPARATUS

TECHNICAL FIELD

The present disclosure relates to a light emitting device and a display and an electronic apparatus each of which includes the light emitting device.

BACKGROUND ART

Liquid crystal displays have been proposed in the past that each include a light source in which a blue light emitting diode, a green phosphor, and a red phosphor are combined (see, for example, PTL 1). In addition, a lighting instrument and an image display have been known that each include a nitride phosphor (see, for example, PTL 2).

CITATION LIST

Patent Literature

PTL 1: Japanese Unexamined Patent Application Publication No. 2007-17781
PTL 2: Japanese Unexamined Patent Application Publication No. 2016-216711

SUMMARY OF THE INVENTION

Incidentally, in recent years, displays have been requested to offer higher-definition display images and display images each having a further expanded color gamut.

It is thus desirable to provide a display and an electronic apparatus that are each able to display an image having a wider color gamut and a light emitting device that is applicable to such a display and an electronic apparatus.

A light emitting device according to an embodiment of the present disclosure includes: a first light source configured to perform an operation of blinking first emission light including first blue light and first red light; and a second light source configured to perform an operation of blinking second emission light independently of the operation of blinking the first emission light by the first light source. The second emission light includes second red light and green light. In addition, a display and an electronic apparatus according to respective embodiments of the present disclosure each include the light emitting device according to the embodiment of the present disclosure described above.

The light emitting device according to the embodiment of the present disclosure achieves color light over a wider color gamut, for example, by alternately turning on the first light source and the second light source. In addition, the display and the electronic apparatus according to the respective embodiments of the present disclosure each display an image having a wider color gamut.

BRIEF DESCRIPTION OF DRAWING

FIG. 1 is a schematic diagram illustrating a display according to a first embodiment of the present disclosure.
FIG. 2 is an enlarged perspective view of a light emitting section of the light emitting device in the display illustrated in FIG. 1.
FIG. 3 is an enlarged cross-sectional view of the light emitting section of the light emitting device in the display illustrated in FIG. 1.
FIG. 4 is a characteristic diagram illustrating a spectral characteristic of the light emitting section of the light emitting device illustrated in FIG. 1.
FIG. 5 is a chromaticity diagram illustrating chromaticity ranges of respective pieces of display light by first emission light and second emission light in the display illustrated in FIG. 1.
FIG. 6 is a timing chart illustrating an example of timings of driving the light emitting device and a liquid crystal display panel in the display illustrated in FIG. 1.
FIG. 7 is a chromaticity diagram illustrating a chromaticity range of display light in the display illustrated in FIG. 1.
FIG. 8A is a cross-sectional view of a light emitting section according to a modification example of the first embodiment.
FIG. 8B is a characteristic diagram illustrating dependency of transmittance of an absorbing filter in the light emitting section in FIG. 8A on a wavelength.
FIG. 10 is a characteristic diagram illustrating a spectral characteristic of the light emitting section of the light emitting device illustrated in FIG. 9.
FIG. 11 is an enlarged cross-sectional view of a light emitting section of a light emitting device in a display according to a third embodiment of the present disclosure.
FIG. 12A is a perspective view of an appearance of a tablet terminal apparatus mounted with a display according to the present disclosure.
FIG. 12B is a perspective view of an appearance of another tablet terminal apparatus mounted with the display according to the present disclosure.
FIG. 13 is a perspective view of an appearance of a first illumination apparatus including the light emitting device according to the present disclosure.
FIG. 14 is a perspective view of an appearance of a second illumination apparatus including the light emitting device according to the present disclosure.
FIG. 15 is a perspective view of an appearance of a third illumination apparatus including the light emitting device according to the present disclosure.
FIG. 16A is a view schematically depicting a general configuration of an operating room system.
FIG. 16B is a view depicting an example of display of an operation screen image of a centralized operation panel.
FIG. 17 is a timing chart illustrating another operation example of the light emitting device in the display illustrated in FIG. 1.

MODES FOR CARRYING OUT THE INVENTION

Figure 9:
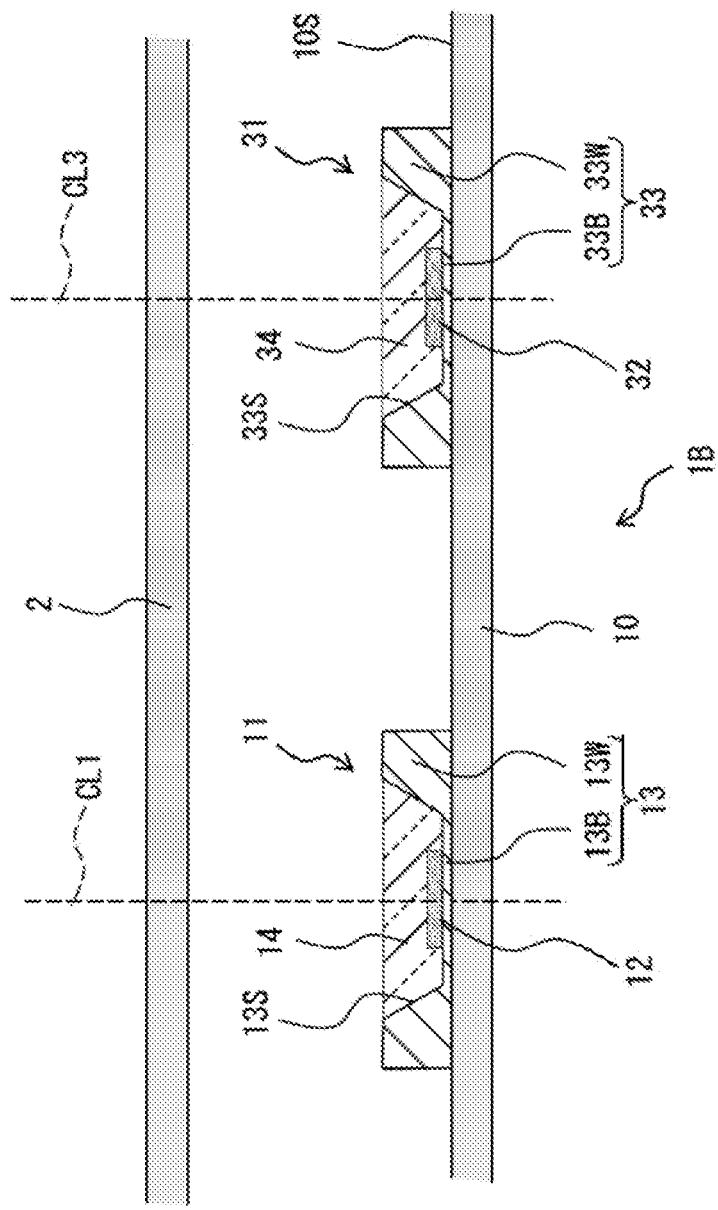
FIG. 9 is an enlarged cross-sectional view of a light emitting section of a light emitting device in a display according to a second embodiment of the present disclosure.

The following describes embodiments of the present disclosure in detail with reference to the drawings. It is to be noted that description is given in the following order.

1. First Embodiment
   (Example of a display including a light emitting device including two types of light sources that respectively include a blue light emitting element and a phosphor layer)
2. Modification Example of First Embodiment
   (Example of a light emitting device including a light source including a blue light absorbing filter)

3 Second Embodiment
(Example of a display including a light emitting device including a first light source including a blue light emitting element and a phosphor layer and a second light source including a green light emitting element and a phosphor layer)
4. Third Embodiment
(Example of a display including a light emitting device including a first light source including a blue light emitting element and a phosphor layer and a second light source including a blue light emitting element, a green light emitting element, and a phosphor layer)
5. Application Example of Display
6. Application Example of Light Emitting Device
7. Practical Application Example
8. Other Modification Examples 1. First Embodiment Configuration of Display FIG. 1 is a schematic diagram illustrating an overall configuration of a display including a light emitting device 1 according to a first embodiment of the present disclosure. FIG. 2 is an enlarged perspective view of a light emitting section 11 (21) that is the main portion of the light emitting device 1. FIG. 3 is a cross-sectional view of the light emitting section 11 (21) in the direction of an arrow taken along a cutting line illustrated in FIG. 1.

This display is, for example, a flat-screen television apparatus including the light emitting device 1, an optical sheet 2, and a liquid crystal display panel 3 disposed in order in the Z axis direction. The liquid crystal display panel 3 is, for example, a transmissive liquid crystal display panel including a liquid crystal layer sandwiched between a pair of transparent electrodes and a color filter. In addition, the light emitting device 1 is a backlight that illuminates the liquid crystal display panel 3 from the back. Further, the optical sheet 2 provided between the light emitting device 1 and the liquid crystal display panel 3 includes, for example, one or more of a diffusion panel, a diffusion sheet, a lens film, and a polarization reflecting sheet. It is to be noted that the optical sheet 2 is not limited to the optical member described above, but may include an optical member having other characteristics.

In this specification, the direction of the distance between the light emitting device 1, the optical sheet 2, and the liquid crystal display panel 3 is defined as the Z axis direction (also referred to as front/back direction or thickness direction). The up/down direction of the widest surface of a substrate 10, the optical sheet 2, or the liquid crystal display panel 3, that is, the principal surface is defined as the X axis direction. The left/right direction of the principal surface is defined as the Y axis direction.

(Configuration of Light Emitting Device 1)

The light emitting device 1 includes, for example, the substrate 10 and the plurality of light emitting sections 11 and the plurality of light emitting sections 21. The plurality of light emitting sections 11 and the plurality of light emitting sections 21 are arranged in a matrix along a surface 10S of the substrate 10 opposed to the optical sheet 2 as illustrated in FIG. 1. It is to be noted that FIG. 1 illustrates an example in which the light emitting sections 11 and the light emitting sections 21 are alternately arranged along both the up/down direction and the left/right direction, but the present disclosure is not limited to this.

(Configuration of Light Emitting Section 11)

With reference to FIGS. 2 and 3, a detailed configuration of the light emitting section 11 is described. The light emitting section 11 is configured to perform operations of turning on and turning off first emission light including first blue light and first red light. The light emitting section 11 is a specific example corresponding to a "first light source" according to the present disclosure. The light emitting section 11 includes a light emitting element 12, a holder 13, and a wavelength converter 14. (A) of FIG. 4 illustrates an example of the spectral characteristics of the first emission light emitted from the light emitting section 11. It is to be noted that FIG. 4 illustrates the wavelength [nm] on the horizontal axis and the radiant intensity [—] on the vertical axis.

The light emitting element 12 is provided on a bottom section 13B of the holder 13. The light emitting element 12 is, for example, blue LED (Light Emitting Diode; light emitting diode) that emits the first blue light. The light emitting element 12 has an optical axis CL1 that coincides, for example, with the Z axis direction. The light emitting element 12 may have a package structure in which a light emitting layer is contained in a resin layer. Alternatively, the light emitting element 12 may be flip chip LED having a light emitting layer provided in an exposed manner. In addition, the first blue light mentioned here is, for example, light that exhibits the maximum intensity in a center wavelength of 430 nm or more and 470 nm or less and a half width of 10 nm or more and 30 nm or less.

The holder 13 is provided on the surface 10S of the substrate 10. The holder 13 includes the bottom section 13B and a wall section 13W. The bottom section 13B supports the light emitting element 12. The wall section 13W surrounds the light emitting element 12 in the XY plane orthogonal to the Z axis direction. In other words, the light emitting element 12 is provided in a recessed section provided in the middle of the holder 13. The central position of the holder 13 in the XY plane may coincide, for example, with the optical axis CL1. It is to be noted that the holder 13 may be shaped to integrally surround the light emitting element 12 with no gap. Further, in the present embodiment, each of the light emitting sections 11 is provided with the one light emitting element 12. The one light emitting element 12 is surrounded by the holder 13, but the present disclosure is not limited to this. For example, each of the light emitting section 11 may be provided with the plurality of light emitting elements 12 and the plurality of those light emitting elements 12 may be supported by the one holder 13.

The holder 13 includes, for example, an inner wall surface 13S opposed to the light emitting element 12. The inner wall surface 13S is a reflecting surface that reflects the first emission light from the light emitting element 12. The inner wall surface 13S may be shaped, for example, to incline farther from the light emitting element 12 as the inner wall surface 13S comes closer to the optical sheet 2 from the surface 10S of the substrate 10.

For example, the recessed section of the holder 13 is filled with the wavelength converter 14. The wavelength converter 14 is provided to cover the light emitting element 12. The wavelength converter 14 includes a first red phosphor that is excited by the first blue light emitted from the light emitting element 12 to emit the first red light. The spectral characteristics of the first red light exhibit an emission line spectrum, for example, as illustrated in (A) of FIG. 4. Examples of the first red phosphor include an KSF phosphor ($K_2SiF_6$: $Mn_{4+}$) or a quantum dot. In a case where the first red phosphor is an KSF phosphor ($K_2SiF_6$: $Mn_{4+}$), the first emission light emitted from the light emitting section 11 exhibits a peak near 630 nm like a peak P11R illustrated in (A) of FIG. 4. Here, the wavelength converter 14 is a specific example corresponding to a "first phosphor layer" according to the present disclosure.

In addition, the wavelength converter 14 transmits a portion of the first blue light emitted from the light emitting element 12 as it is without converting the portion of the first blue light into the first red light. The first emission light emitted from the light emitting section 11 thus exhibits, for example, a peak having a center wavelength of 430 nm or more and 470 nm or less and a half width of 10 nm or more and 30 nm or less as a spectral characteristic like a peak PUB illustrated in (A) of FIG. 4.

In this way, the first emission light emitted from the light emitting section 11 includes the first blue light and the first red light, but does not substantially include the green light. In other words, in the first emission light, the first blue light and the first red light are subjected to sufficient color separation. This is advantageous to increase the color purity of light emitted from the light emitting device 1.

(Configuration of Light Emitting Section 21)

With reference to FIGS. 2 and 3, a detailed configuration of the light emitting section 21 is described. The light emitting section 21 is configured to perform operations of turning on and turning off second emission light including second red light and green light. The light emitting section 21 is a specific example corresponding to a "second light source" according to the present disclosure. Here, it is possible to independently perform the operations of turning on and turning off the first emission light by the light emitting section 11, that is, an operation of blinking the first emission light, and an operation of blinking the second emission light by the light emitting section 21. The light emitting section 21 includes a light emitting element 22, a holder 23, and a wavelength converter 24. (B) of FIG. 4 illustrates an example of the spectral characteristics of the second emission light with respect to a wavelength. The second emission light is emitted from the light emitting section 21.

The light emitting element 22 is provided on a bottom section 23B of the holder 23 as illustrated in FIG. 2. The light emitting element 22 is, for example, blue LED that emits second blue light. The light emitting element 22 has the optical axis CL1 that coincides, for example, with the Z axis direction. The light emitting element 22 may have a package structure in which a light emitting layer is contained in a resin layer. Alternatively, the light emitting element 22 may be flip chip LED having a light emitting layer provided in an exposed manner. In addition, the second blue light mentioned here is, for example, light that exhibits the maximum peak having a center wavelength of 430 nm or more and 470 nm or less and a half width of 10 nm or more and 30 nm or less as with the first blue light emitted from the light emitting element 12. It is to be noted that the first blue light and the second blue light may have substantially the same spectral characteristics or may have different spectral characteristics from each other.

The holder 23 is provided on the surface 10S of the substrate 10 as with the holder 13. The holder 23 includes the bottom section 23B and a wall section 23W. The bottom section 23B supports the light emitting element 22. The wall section 23W surrounds the light emitting element 12 in the XY plane orthogonal to the Z axis direction. In other words, the light emitting element 22 is provided in a recessed section provided in the middle of the holder 23. The central position of the holder 23 in the XY plane may coincide, for example, with an optical axis CL2. It is to be noted that the holder 23 may be shaped to integrally surround the light emitting element 22 with no gap. Further, in the present embodiment, each of the light emitting sections 21 is provided with the one light emitting element 22. The one light emitting element 22 is surrounded by the holder 23, but the present disclosure is not limited to this. For example, each of the light emitting section 21 may be provided with the plurality of light emitting elements 22 and the plurality of those light emitting elements 22 may be supported by the one holder 23.

The holder 23 includes, for example, an inner wall surface 23S opposed to the light emitting element 22. The inner wall surface 23S is a reflecting surface that reflects the second emission light from the light emitting element 22. The inner wall surface 23S may be shaped, for example, to incline farther from the light emitting element 22 as the inner wall surface 23S comes closer to the optical sheet 2 from the surface 10S of the substrate 10.

For example, the recessed section of the holder 23 is filled with the wavelength converter 24. The wavelength converter 24 is provided to cover the light emitting element 22. The wavelength converter 24 includes a second red phosphor that is excited by the second blue light emitted from the light emitting element 22 to emit the second red light. The spectral characteristics of the second red light exhibit a continuous spectrum, for example, like a peak P21R illustrated in (B) of FIG. 4. In other words, the half width of the maximum peak of the first red light emitted from the first red phosphor of the wavelength converter 14 in the light emitting section 11 is narrower than the half width of the maximum peak of the second red light emitted from the second red phosphor of the wavelength converter 24.

Further, the wavelength converter 24 includes a green phosphor that is excited by the second blue light emitted from the light emitting element 22 to emit the green light. Examples of the green phosphor include an oxynitride phosphor or a YAG phosphor ($Y_3(Al, Ga)_5O_{12}: Ce_{3+}$). The oxynitride phosphor includes respective elements of Si (silicon), Al (aluminum), O (oxygen), and N (nitrogen). In a case where the green phosphor is an oxynitride phosphor called βSiAlON, a radiant intensity peak appears that has, for example, a center wavelength of 520 nm or more and 560 nm or less and a half width of 40 nm or more and 65 nm or less as a spectral characteristic like a peak P21G illustrated in (B) of FIG. 4.

In the light emitting section 21, the wavelength converter 24 converts substantially the whole of the second blue light emitted from the light emitting element 22 into the second red light and the green light. The second emission light emitted from the light emitting section 21 thus includes substantially no blue component as a spectral characteristic as illustrated in (B) of FIG. 4.

The display according to the present embodiment further includes a controller 4 as illustrated in FIG. 1. The controller 4 includes an image signal processing circuit 4A, an LED control circuit 4B, and an LCD control circuit 4C. The image signal processing circuit 4A generates a display control signal in accordance with an input signal from an external apparatus and transmits the display control signal to the LCD control circuit 4C. The image signal processing circuit 4A further generates a backlight control signal for controlling the light emitting device 1 serving as a backlight and transmits the backlight control signal to the LED control circuit 4B. The LED control circuit 4B controls the operations of turning on the light and turning off the light by the light emitting sections 11 and 21 in the light emitting device 1 on the basis of the backlight control signal from the image signal processing circuit 4A. The LCD control circuit 4C controls an operation of displaying an image by the liquid crystal display panel 3 on the basis of the display control signal from the image signal processing circuit 4A. The image signal processing circuit 4A further synchronizes the operation of displaying an image by the liquid crystal display panel 3 and the operations of blinking the light by the light emitting section 11 and 21 in the light emitting device 1.

[Workings and Effects of Display]

In this way, in the display according to the present embodiment, the light emitting device 1 includes the light emitting section 11 that emits the first emission light and the light emitting section 21 that emits the second emission light. Those light emitting section 11 and light emitting section 21 are configured to be able to independently perform operations of blinking the light.

FIG. 5 is a chromaticity diagram illustrating the chromaticity range (color gamut) of display light in the display according to the present embodiment. In FIG. 5, a triangle TR11 indicates a chromaticity range obtained in a case where the light emitting section 11 of the light emitting device 1 is turned on and the light emitting section 21 is turned off. In other words, the triangle TR11 indicates the chromaticity range of the first emission light. The triangle TR11 connects the three points of a point 11R, a point 11G, and a point 11B. In addition, in FIG. 5, a triangle TR21 indicates a chromaticity range obtained in a case where the light emitting section 11 of the light emitting device 1 is turned off and the light emitting section 21 is turned on. In other words, the triangle TR21 indicates the chromaticity range of the second emission light. The triangle TR21 connects the three points of a point 21R, a point 21G, and a point 21B. It is to be noted that each of the points 11R and 21R is a chromaticity point (chromaticity coordinates) obtained in a case where the liquid crystal display panel 3 is subjected to red display. In the red display, only the pixels in which red filters are disposed are selectively displayed. Each of the points 11G and 21G is a chromaticity point obtained in a case where the liquid crystal display panel 3 is subjected to green display. In the green display, only the pixels in which green filters are disposed are selectively displayed. Each of the points 11B and 21B is a chromaticity point obtained in a case where the liquid crystal display panel 3 is subjected to blue display. In the blue display, only the pixels in which blue filters are disposed are selectively displayed. Further, FIG. 5 uses a dashed line to illustrate the chromaticity range (referred to as BT.2020 chromaticity range below) defined in the international standard BT.2020 (Broadcasting service television 2020) formulated by the International Telecommunication Union Radiocommunication Sector (ITU-R).

As illustrated in FIG. 5, the chromaticity range of the first emission light indicated by the triangle TR11 is biased toward magenta. The chromaticity range of the second emission light indicated by the triangle TR21 is biased toward yellow. It is not thus possible to display a large portion of the BT.2020 chromaticity range by using the first emission light alone from the light emitting section 11. Similarly, it is not possible to display a large portion of the BT.2020 chromaticity range by using the second emission light alone from the light emitting section 21.

However, the display according to the present embodiment offers a mixed color of the first emission light and the second emission light by concurrently turning on the light emitting section 11 and the light emitting section 21. In other words, it is possible to display the color corresponding to the chromaticity point of the intermediate chromaticity range between the chromaticity range of the first emission light indicated by the triangle TR11 and the chromaticity range of the second emission light indicated by the triangle TR21 in FIG. 5. In that case, the balance is adjusted between the radiant intensity of the light emitting section 11 and the radiant intensity of the light emitting section 21. This makes it possible to display the color of any chromaticity point between the chromaticity range of the first emission light indicated by the triangle TR11 and the chromaticity range of the second emission light indicated by the triangle TR21.

Here, the light emitting device 1 is controlled by the LED control circuit 4B on the basis of the image signal processing circuit 4A, thereby causing the display according to the present embodiment to alternately perform the operation of turning on the light by the light emitting section 11 and the operation of turning on the light by the light emitting section 21, for example, as illustrated in FIG. 6. The LCD control circuit 4C controls the liquid crystal display panel 3 on the basis of the image signal processing circuit 4A, thereby causing this display to further display a first image and a second image alternately as illustrated in FIG. 6. The first image corresponds to the first emission light by the light emitting section 11. The second image corresponds to the second emission light by the light emitting section 21. In that case, the image signal processing circuit 4A synchronizes the operation of displaying an image by the liquid crystal display panel 3 and the operations of blinking the light by the light emitting section 11 and 21 in the light emitting device 1. Specifically, one display frame is equally divided into two subframes including a first subframe 1 and a second subframe 2. In the first subframe 1, the light emitting section 11 is turned on and the first image is displayed on the liquid crystal display panel 3. In the subsequent second subframe 2, the light emitting section 21 is turned on and the second image is displayed on the liquid crystal display panel 3. Similarly, in each of the subsequent display frames, the image signal processing circuit 4A causes the LED control circuit 4B and the LCD control circuit 4C to control the light emitting device 1 and the liquid crystal display panel 3. It is to be noted that FIG. 6 is a timing chart illustrating an example of timings of driving the light emitting device 1 and the liquid crystal display panel 3 in the display according to the present embodiment.

In this way, the display according to the present embodiment prepares the first image and the second image in units of display frames and displays them in a time division manner. The first image corresponds to the first emission light by the light emitting section 11. The second image corresponds to the second emission light by the light emitting section 21. This makes it possible to display the color of any chromaticity point over a wider chromaticity range, for example, as indicated by a triangle TR in the chromaticity diagram of FIG. 7. FIG. 7 is a chromaticity diagram illustrating the chromaticity range of a display color that the display according to the present embodiment is able to display.

In this way, the light emitting device 1 according to the present embodiment alternately turns on the light emitting section 11 and the light emitting section 21, thereby making it possible to emit color light over a wider color gamut. The display according to the present embodiment including the light emitting device 1 thus makes it possible to display an image having a wider color gamut.

2. Modification Example of First Embodiment

FIG. 8A is a cross-sectional view of a light emitting section 21A in a light emitting device 1A according to a modification example of the light emitting device 1 according to the first embodiment described above. As illustrated in FIG. 8A, the light emitting section 21A further includes a blue light absorbing filter 25 disposed to be opposed to the surface 10S of the substrates 10 to cover the light emitting element 22. FIG. 8B illustrates the dependency of the transmittance of the blue light absorbing filter 25 on a wavelength.

The light emitting section 21A is provided with the blue light absorbing filter 25. This makes it possible to absorb the second blue light from the light emitting element 22. The second blue light is included in the second emission light. As a result, it is possible to prevent the direct light (second blue light) from the light emitting element 22 from leaking from the light emitting section 21A. The direct light (second blue light) is originally unnecessary. The light emitting device 1A therefore makes it possible to expect a further increase in color purity.

3 Second Embodiment

Configuration of Display

FIG. 9 is an enlarged cross-sectional view of the main portion of a light emitting device 1B according to a second embodiment of the present disclosure and corresponds to FIG. 3 described in the first embodiment described above. The light emitting device 1 according to the first embodiment described above includes the light emitting section 21 as a second light source that emits the second emission light. In contrast, the light emitting device 1B according to the present embodiment includes a light emitting section 31 as a second light source that emits the second emission light in place of the light emitting section 21. Except for this point, the light emitting device 1B has substantially the same configuration as that of the light emitting device 1 according to the first embodiment described above with respect to the other points.

(Configuration of Light Emitting Section 31)

With reference to FIG. 9, a detailed configuration of the light emitting section 31 is described. The light emitting section 31 is configured to perform the operations of turning on and turning off the second emission light including the second red light and the green light as with the light emitting section 21. The light emitting section 31 is a specific example corresponding to the "second light source" according to the present disclosure. In the light emitting device 1B, it is possible to independently perform the operation of blinking the first emission light by the light emitting section 11 and the operation of blinking the second emission light by the light emitting section 31. The light emitting section 31 includes a light emitting element 32, a holder 33, and a wavelength converter 34. FIG. 10 illustrates an example of the spectral characteristics of the second emission light emitted from the light emitting section 31. It is to be noted that FIG. 10 illustrates the wavelength [nm] on the horizontal axis and the radiant intensity [-] on the vertical axis.

The light emitting element 32 is provided on a bottom section 33B of the holder 33. The light emitting element 32 is, for example, green LED that emits the green light. The light emitting element 32 has an optical axis CL3 that coincides, for example, with the Z axis direction. The light emitting element 32 may have a package structure in which a light emitting layer is contained in a resin layer. Alternatively, the light emitting element 32 may be flip chip LED having a light emitting layer provided in an exposed manner. In addition, the green light mentioned here is, for example, light that exhibits the maximum peak having a center wavelength of 520 nm or more and 540 nm or less and a half width of 20 nm or more and 40 nm or less.

The holder 33 has a configuration similar to those of the holder 13 and the holder 23. Specifically, the holder 33 is provided on the surface 10S of the substrate 10. The holder 33 includes the bottom section 33B and a wall section 33W. The bottom section 33B supports the light emitting element 32. The wall section 33W surrounds the light emitting element 32 in the XY plane orthogonal to the Z axis direction. In other words, the light emitting element 32 is provided in a recessed section provided in the middle of the holder 33. The central position of the holder 33 in the XY plane may coincide, for example, with the optical axis CL3. Further, in the present embodiment, each of the light emitting sections 31 is provided with the one light emitting element 32. The one light emitting element 32 is surrounded by the holder 33, but the present disclosure is not limited to this. For example, each of the light emitting section 31 may be provided with the plurality of light emitting elements 32 and the plurality of those light emitting elements 32 may be supported by the one holder 33.

For example, the recessed section of the holder 33 is filled with the wavelength converter 34. The wavelength converter 34 is provided to cover the light emitting element 32. The wavelength converter 34 includes a second red phosphor that is excited by the green light emitted from the light emitting element 32 to emit the second red light. The spectral characteristics of the second red light exhibit a continuous spectrum, for example, like a peak P31R illustrated in FIG. 10. In other words, the half width of the maximum peak of the first red light emitted from the first red phosphor of the wavelength converter 14 in the light emitting section 11 is narrower than the half width of the maximum peak of the second red light emitted from the second red phosphor of the wavelength converter 34.

The second emission light emitted from the light emitting section 31 includes substantially no blue component as a spectral characteristic as illustrated in FIG. 10.

[Workings and Effects of Display]

The light emitting device 1B according to the present embodiment also alternately turns on the light emitting section 11 and the light emitting section 31, thereby making it possible to emit color light over a wider color gamut. The display according to the present embodiment including the light emitting device 1B thus makes it possible to display an image having a wider color gamut.

4. Third Embodiment

Configuration of Display

FIG. 11 is an enlarged cross-sectional view of the main portion of a light emitting device 1C according to a third embodiment of the present disclosure and corresponds to FIG. 3 described in the first embodiment described above. The light emitting device 1 according to the first embodiment described above includes the light emitting section 21 as a second light source that emits the second emission light. In contrast, the light emitting device 1C according to the present embodiment includes a light emitting section 41 as a second light source that emits the second emission light in place of the light emitting section 21. Except for this point, the light emitting device 1C has substantially the same configuration as that of the light emitting device 1 according to the first embodiment described above with respect to the other points. The following description thus describes a difference between the light emitting section 21 and the light emitting section 41 with emphasis and the description of the other components that are substantially the same is omitted as appropriate.

(Configuration of Light Emitting Section 41)

With reference to FIG. 11, a detailed configuration of the light emitting section 41 is described. The light emitting section 41 is configured to perform the operations of turning on and turning off the second emission light including the second red light and the green light as with the light emitting section 21. The light emitting section 41 is a specific example corresponding to the "second light source" according to the present disclosure. In the light emitting device 1C, it is possible to independently perform the operation of blinking the first emission light by the light emitting section 11 and the operation of blinking the second emission light by the light emitting section 41. The light emitting section 41 includes a light emitting element 42B, a light emitting element 42G, a holder 43, and a wavelength converter 44.

The light emitting element 42B and the light emitting element 42G is provided on a bottom section 43B of the holder 43. The light emitting element 42B is, for example, blue LED that emits the second blue light. The light emitting element 42G is, for example, green LED that emits the green light. The light emitting element 42B and the light emitting element 42G respectively have an optical axis CL4B and an optical axis CL4G that each coincide, for example, with the Z axis direction. Each of the light emitting element 42B and the light emitting element 42G may have a package structure in which a light emitting layer is contained in a resin layer. Alternatively, each of the light emitting element 42B and the light emitting element 42G may be flip chip LED having a light emitting layer provided in an exposed manner. The second blue light emitted from the light emitting element 42B is, for example, light that exhibits the maximum peak having a center wavelength of 430 nm or more and 470 nm or less and a half width of 10 nm or more and 30 nm or less as with the light emitting element 22 according to the first embodiment described above. In addition, the green light emitted from the light emitting element 42G is, for example, light that exhibits the maximum peak having a center wavelength of 520 nm or more and 540 nm or less and a half width of 20 nm or more and 40 nm or less as with the light emitting element 32 according to the second embodiment described above.

The holder 43 has a configuration similar to those of the holder 13, the holder 23, and the holder 33. Specifically, the holder 43 is provided on the surface 10S of the substrate 10. The holder 43 includes the bottom section 43B and a wall section 43W. The bottom section 43B supports the light emitting element 42B and the light emitting element 42G. The wall section 43W surrounds the light emitting element 42B and the light emitting element 42G in the XY plane orthogonal to the Z axis direction. In other words, each of the light emitting element 42B and the light emitting element 42G is provided in a recessed section provided in the middle of the holder 43. The central position of the holder 43 in the XY plane may coincide, for example, with the intermediate point between the optical axis CL4B and the optical axis CL4G. Further, in the present embodiment, each of the light emitting sections 41 is provided with the one light emitting element 42B and the one light emitting element 42G. These two light emitting elements 42B and 42G are surrounded by the holder 43. The present disclosure is not, however, limited to this. For example, the plurality of light emitting elements 42B and the plurality of light emitting elements 42G may be disposed for each of the light emitting sections 41. Those light emitting elements 42B and 42G may be supported by the one holder 43.

The holder 43 includes, for example, an inner wall surface 43S opposed to the light emitting element 42B and the light emitting element 42G. The inner wall surface 43S is a reflecting surface that reflects the second emission light from the light emitting element 42B and the light emitting element 42G. The inner wall surface 43S may incline, for example, farther from the light emitting element 42B and the light emitting element 42G as the inner wall surface 43S comes closer to the optical sheet 2 from the surface 10S of the substrate 10.

For example, the recessed section of the holder 43 is filled with the wavelength converter 44. The wavelength converter 44 is provided to cover the light emitting element 42B and the light emitting element 42G. The wavelength converter 44 includes a second red phosphor that is excited by the second blue light emitted from the light emitting element 42B and the green light emitted from the light emitting element 42G to emit the second red light. The spectral characteristics of the second red light exhibit a continuous spectrum, for example, like the peak P31R illustrated in FIG. 10.

In the wavelength converter 44, the second red phosphor absorbs a large portion of the second blue light emitted from the light emitting element 42B. Therefore, the second emission light emitted from the light emitting section 41 includes substantially no blue component as a spectral characteristic. In contrast, a portion of the green light emitted from the light emitting element 42G is absorbed by the second red phosphor and converted into the second red light. The remaining portion of the green light emitted from the light emitting element 42G is not, however, converted into the second red light, but passes through the second red phosphor as it is. The second emission light emitted from the light emitting section 41 thus includes a green component as a spectral characteristic.

Workings and Effects of Display

The light emitting device 1C according to the present embodiment also alternately turns on the light emitting section 11 and the light emitting section 41, thereby making it possible to emit color light over a wider color gamut. The display according to the present embodiment including the light emitting device 1C thus makes it possible to display an image having a wider color gamut.

5. Application Example of Display

The following describes an application example of the display according to the embodiment described above to an electronic apparatus. Examples of the electronic apparatus include a television apparatus, a digital camera, a notebook personal computer, a portable terminal apparatus such as a mobile phone, a video camera, or the like. In other words, the display described above is applicable to an electronic apparatus in any field that displays an image signal inputted from the outside or an image signal generated inside as an image or video.

FIG. 12A illustrates the appearance of a tablet terminal apparatus to which the display according to the embodiment described above is applied. FIG. 12B illustrates the appearance of another tablet terminal apparatus to which the display according to the embodiment described above is applied. Each of these tablet terminal apparatuses includes, for example, a display unit 210 and a non-display unit 220.

This display unit 210 includes the display according to the embodiment described above.

6. Application Example of Light Emitting Device

Each of FIGS. 13 and 14 illustrates the appearance of a desktop illumination apparatus to which the light emitting device 1 according to the embodiment described above or the like is applied. For example, this illumination apparatus includes an illumination unit 843 that is attached to a supporting post 842 provided on a base mount 841. This illumination unit 843 includes the light emitting device 1 or the like. Shaping the substrate 10, the optical sheet 2, and the like to curve allows the illumination unit 843 to have any shape such as a cylindrical shape illustrated in FIG. 13 or a curved shape illustrated in FIG. 14.

FIG. 15 illustrates the appearance of an indoor illumination apparatus to which the light emitting device 1 according to the embodiment described above or the like is applied. This illumination apparatus includes the illumination unit 844 including the light emitting device 1 and the like. An appropriate number of illumination units 844 are disposed at appropriate intervals on a ceiling 850A of a building. It is to be noted that the illumination unit 844 is installable not only on the ceiling 850A, but also in any place such as a wall 850B or a floor (not illustrated) in accordance with use.

In these illumination apparatuses, illumination is performed by using light from the light emitting device 1 or the like. Here, each of the illumination apparatuses includes the light emitting device 1 or the like that has superior light emission efficiency and more uniform in-plane radiant intensity distribution, increasing the illumination quality.

7. Practical Application Example

The technology according to the present disclosure is applicable to a variety of products. For example, the technology according to the present disclosure may be applied to an operating room system.

FIG. 16A is a view schematically depicting a general configuration of an operating room system 5100 to which the technology according to an embodiment of the present disclosure can be applied. Referring to FIG. 16A, the operating room system 5100 is configured such that a group of apparatus installed in an operating room are connected for cooperation with each other through an audiovisual (AV) controller 5107 and an operating room controlling apparatus 5109.

In the operating room, various apparatus may be installed. In FIG. 16A, as an example, various apparatus group 5101 for endoscopic surgery, a ceiling camera 5187, a surgery field camera 5189, a plurality of display apparatus 5103A to 5103D, a recorder 5105, a patient bed 5183 and an illumination 5191 are depicted. The ceiling camera 5187 is provided on the ceiling of an operating room and images the hands of a surgeon. The surgery field camera 5189 is provided on the ceiling of the operating room and images a state of the entire operating room. Among the apparatus mentioned, the apparatus group 5101 belongs to an endoscopic surgery system 5113 hereinafter described and include an endoscope, a display apparatus which displays an image picked up by the endoscope and so forth. Various apparatus belonging to the endoscopic surgery system 5113 are referred to also as medical equipment. Meanwhile, the display apparatus 5103A to 5103D, the recorder 5105, the patient bed 5183 and the illumination 5191 are apparatus which are equipped, for example, in the operating room separately from the endoscopic surgery system 5113. The apparatus which do not belong to the endoscopic surgery system 5113 are referred to also as non-medical equipment. The audiovisual controller 5107 and/or the operating room controlling apparatus 5109 cooperatively control operation of the medical equipment and the non-medical equipment with each other.

For example, to the audiovisual controller 5107, information relating to an image of a surgical region in a body cavity of a patient imaged by the endo scope may be transmitted as the display information from the apparatus group 5101. The audiovisual controller 5107 controls at least one of the display apparatus 5103A to 5103D, which are apparatus of an output destination, to display acquired display information (namely, images picked up during surgery or various pieces of information relating to the surgery). In the example depicted, the display apparatus 5103A is a display apparatus installed so as to be suspended from the ceiling of the operating room; the display apparatus 5103B is a display apparatus installed on a wall face of the operating room; the display apparatus 5103C is a display apparatus installed on a desk in the operating room; and the display apparatus 5103D is a mobile apparatus (for example, a tablet personal computer (PC)) having a display function.

In the operating room system 5100, a centralized operation panel 5111 is provided such that it is possible to issue an instruction regarding image display to the audiovisual controller 5107 or issue an instruction regarding operation of the non-medical equipment to the operating room controlling apparatus 5109 through the centralized operation panel 5111.

FIG. 16B is a view depicting an example of display of an operation screen image on the centralized operation panel 5111. In FIG. 15B, as an example, an operation screen image is depicted which corresponds to a case in which two display apparatus are provided as apparatus of an output destination in the operating room system 5100. Referring to FIG. 16B, the operation screen image 5193 includes a sending source selection region 5195, a preview region 5197 and a control region 5201.

In the sending source selection region 5195, the sending source apparatus provided in the operating room system 5100 and thumbnail screen images representative of display information the sending source apparatus have are displayed in an associated manner with each other. In the preview region 5197, a preview of screen images displayed on two display apparatus (Monitor 1 and Monitor 2) which are apparatus of an output destination is displayed. A sending source operation region 5203 and an output destination operation region 5205 are provided in the control region 5201. In the sending source operation region 5203, a graphical user interface (GUI) part for performing an operation for an apparatus of a sending source is displayed. In the output destination operation region 5205, a GUI part for performing an operation for an apparatus of an output destination is displayed. In the output destination operation region 5205, GUI parts for performing various operations for display on a display apparatus which is an apparatus of an output destination (swap, flip, color adjustment, contrast adjustment and switching between two dimensional (2D) display and three dimensional (3D) display) are provided.

Further, the technology according to the present disclosure is also favorable for a liquid crystal display, for example, for film production. A display including the light emitting device 1 to which the technology according to the present technology is applied is excellent in reproducibility of a wide range of color gamut. Therefore, it is possible to support the current broadcasting standard and the next generation broadcasting standard used for the digital cinema.

<8. Other Modification Examples

Although the above has described the present disclosure with reference to the embodiments and the experimental examples, the present disclosure is not limited to the embodiment or the like described above. It is possible to make a variety of modifications. For example, the configuration of the display or the light emitting device has been specifically described above in the embodiment or the like described above. However, it is not necessary to include all of the components. In addition, other components may be included.

In the first embodiment described above, the light emitting section 11 serving as the first light source and the light emitting section 21 serving as the second light source are displayed in a time division manner, but the present disclosure is not limited to this. For example, the light emitting section 11 and the light emitting section 21 may be concurrently turned on. In that case, it is sufficient if the light emitting section 21 of the light emitting section 11 and the light emitting section 21 both of which are on is turned off after the light emitting section 11 is turned off, for example, as in the timing chart illustrated in FIG. 17. The first red phosphor including the KSF phosphor ($K_2SiF_6$: $Mn_{4+}$) has a longer afterglow time than that of the second red phosphor. Therefore, in a case where the light emitting section 11 and the light emitting section 21 are concurrently turned off, a red afterglow AG caused by the first red phosphor is visually recognized. Turning off the light emitting section 11 earlier than the light emitting section 21 thus allows the second emission light from the light emitting section 21 to make the red afterglow AG inconspicuous.

In this way, the light emitting device according to the embodiment of the present disclosure makes it possible to emit color light over a wider color gamut. In addition, the display and the electronic apparatus according to the respective embodiments of the present disclosure each make it possible to display an image having a wider color gamut while maintaining the display performance.

It is to be noted that the effects described in this specification are merely illustrative, but not limited to the description. There may be other effects. In addition, the present technology may have configurations as follows.

(1)
A light emitting device including:
a first light source configured to perform an operation of blinking first emission light including first blue light and first red light; and
a second light source configured to perform an operation of blinking second emission light independently of the operation of blinking the first emission light by the first light source, the second emission light including second red light and green light.

(2)
The light emitting device according to (1), in which
the first light source includes a first blue light emitting element and a first phosphor layer, the first blue light emitting element emitting the first blue light, the first phosphor layer including a first red phosphor that is excited by the first blue light to emit the first red light, and
the second light source includes a second blue light emitting element and a second phosphor layer, the second blue light emitting element emitting second blue light, the second phosphor layer including a second red phosphor and a green phosphor, the second red phosphor being excited by the second blue light to emit the second red light, the green phosphor being excited by the second blue light to emit the green light.

(3)
The light emitting device according to (1), in which
the first light source includes a first blue light emitting element and a first phosphor layer, the first blue light emitting element emitting the first blue light, the first phosphor layer including a first red phosphor that is excited by the first blue light to emit the first red light, and
the second light source includes a green light emitting element and a second phosphor layer, the green light emitting element emitting the green light, the second phosphor layer including a second red phosphor that is excited by the green light to emit the second red light.

(4)
The light emitting device according to (1), in which
the first light source includes a first blue light emitting element and a first phosphor layer, the first blue light emitting element emitting the first blue light, the first phosphor layer including a first red phosphor that is excited by the first blue light to emit the first red light, and
the second light source includes a second blue light emitting element, a green light emitting element, and a second phosphor layer, the second blue light emitting element emitting second blue light, the green light emitting element emitting the green light, the second phosphor layer including a second red phosphor that is excited by both the second blue light and the green light to emit the second red light.

(5)
The light emitting device according to any one of (1) to (4), in which a half width of a maximum peak of the first red light is narrower than a half width of a maximum peak of the second red light.

(6)
The light emitting device according to any one of (1) to (5), in which
intensity distribution of the first red light with respect to a wavelength exhibits an emission line spectrum, and
intensity distribution of the second red light with respect to a wavelength exhibits a continuous spectrum.

(7)
The light emitting device according to (2), in which the first red phosphor includes an KSF phosphor ($K_2SiF_6$: $Mn_{4+}$) or a quantum dot.

(8)
The light emitting device according to (2), in which
the second red phosphor includes a nitride phosphor including respective elements of Ca (calcium), Al (aluminum), Si (silicon), and N (nitrogen), and
the green phosphor includes an oxynitride phosphor or a YAG phosphor ($Y_3(Al, Ga)_5O_{12}$: $Ce_{3+}$), the oxynitride phosphor including respective elements of Si (silicon), Al (aluminum), O (oxygen), and N (nitrogen).

(9)
The light emitting device according to any one of (1) to (8), in which the second light source of the first light source and the second light source both of which are on is turned off after the first light source is turned off.

(10)

The light emitting device according to (1) or (2), in which the second light source further includes a blue light component cut filter that prevents a blue light component from passing through the blue light component cut filter.

(11)

A display including:

a light emitting device; and a display panel that displays an image by using light from the light emitting device, in which the light emitting device includes a first light source configured to perform an operation of blinking first emission light including first blue light and first red light, and a second light source configured to perform an operation of blinking second emission light independently of the operation of blinking the first emission light by the first light source, the second emission light including second red light and green light.

(12)

The display according to (11), further including a controller that synchronizes a lighting switch operation and a display switch operation, the lighting switch operation being for switching an operation of turning on the first light source and an operation of turning on the second light source, the display switch operation being for switching an operation of displaying a first image corresponding to the first emission light and an operation of displaying a second image corresponding to the second emission light.

(13)

An electronic apparatus including a display including a light emitting device and a display panel that displays an image by using light from the light emitting device, in which the light emitting device includes a first light source configured to perform an operation of blinking first emission light including first blue light and first red light, and a second light source configured to perform an operation of blinking second emission light independently of the operation of blinking the first emission light by the first light source, the second emission light including second red light and green light.

The present application claims the priority on the basis of Japanese Patent Application No. 2019-66654 filed on Mar. 29, 2019 with Japan Patent Office, the entire contents of which are incorporated in the present application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A light emitting device comprising:

a first light source configured to perform an operation of pulsing first emission light including first blue light and first red light; and a second light source configured to perform an operation of pulsing second emission light independently of the operation of pulsing the first emission light by the first light source, the second emission light including second red light or green light, the second light source comprises a light emitter and a color conversion material directly on the light emitter, wherein the first light source and the second light source are configured to be concurrently turned on, and the second light source is turned off after the first light source is turned off.

2. The light emitting device according to claim 1, wherein the first light source includes a first blue light emitting element and a first phosphor layer, the first blue light emitting element emitting the first blue light, the first phosphor layer including a first red phosphor that is excited by the first blue light to emit the first red light.

3. The light emitting device according to claim 2, wherein the second light source includes a second blue light emitting element and a second phosphor layer, the second blue light emitting element emitting second blue light, the second phosphor layer including a second red phosphor, the second red phosphor being excited by the second blue light to emit the second red light.

4. The light emitting device according to claim 2, wherein the second light source includes a second blue light emitting element and a second phosphor layer, the second blue light emitting element emitting second blue light, the second phosphor layer including a green phosphor, the green phosphor being excited by the second blue light to emit the green light.

5. The light emitting device according to claim 2, wherein the second light source includes a second blue light emitting element and a second phosphor layer, the second blue light emitting element emitting second blue light, the second phosphor layer including a second red phosphor and a green phosphor, the second red phosphor being excited by the second blue light to emit the second red light, the green phosphor being excited by the second blue light to emit the green light.

6. The light emitting device according to claim 1, wherein the first light source includes a first blue light emitting element and a first phosphor layer, the first blue light emitting element emitting the first blue light, the first phosphor layer including a first red phosphor that is excited by the first blue light to emit the first red light, and the second light source includes a second blue light emitting element, a green light emitting element, and a second phosphor layer, the second blue light emitting element emitting second blue light, the green light emitting element emitting the green light, the second phosphor layer including a second red phosphor that is excited by both the second blue light and the green light to emit the second red light.

7. The light emitting device according to claim 2, wherein a half width of a maximum peak of the first red light is narrower than a half width of a maximum peak of the second red light.

8. The light emitting device according to claim 2, wherein intensity distribution of the first red light with respect to a wavelength exhibits an emission line spectrum, and intensity distribution of the second red light with respect to a wavelength exhibits a continuous spectrum.

9. The light emitting device according to claim 2, wherein the first red phosphor includes an KSF phosphor ($K_2SiF_6$:$Mn_{4+}$) or a quantum dot.

10. The light emitting device according to claim 1, wherein the second light source further includes a blue light component cut filter over the color conversion material that prevents a blue light component from passing through the blue light component cut filter.

11. A display comprising:
a light emitting device; and
a display panel that displays an image by using light from the light emitting device, wherein
the light emitting device includes
a first light source configured to perform an operation of pulsing first emission light including first blue light and first red light; and
a second light source configured to perform an operation of pulsing second emission light independently of the operation of pulsing the first emission light by the first light source, the second emission light including second red light or green light, the second light source comprises a light emitter and a color conversion material directly on the light emitter,
wherein the first light source and the second light source are configured to be concurrently turned on, and the second light source is turned off after the first light source is turned off.

12. The display according to claim 11, further comprising a controller that synchronizes a lighting switch operation and a display switch operation, the lighting switch operation being for switching an operation of turning on the first light source and an operation of turning on the second light source, the display switch operation being for switching an operation of displaying a first image corresponding to the first emission light and an operation of displaying a second image corresponding to the second emission light.

13. The display according to claim 11, wherein
the first light source includes a first blue light emitting element and a first phosphor layer, the first blue light emitting element emitting the first blue light, the first phosphor layer including a first red phosphor that is excited by the first blue light to emit the first red light.

14. The display according to claim 13, wherein
the second light source includes a second blue light emitting element and a second phosphor layer, the second blue light emitting element emitting second blue light, the second phosphor layer including a second red phosphor, the second red phosphor being excited by the second blue light to emit the second red light.

15. The display according to claim 13, wherein
the second light source includes a second blue light emitting element and a second phosphor layer, the second blue light emitting element emitting second blue light, the second phosphor layer including a green phosphor, the green phosphor being excited by the second blue light to emit the green light.

16. The display according to claim 11, wherein
the second light source includes a second blue light emitting element and a second phosphor layer, the second blue light emitting element emitting second blue light, the second phosphor layer including a second red phosphor and a green phosphor, the second red phosphor being excited by the second blue light to emit the second red light, the green phosphor being excited by the second blue light to emit the green light.

17. The display according to claim 11, wherein
the first light source includes a first blue light emitting element and a first phosphor layer, the first blue light emitting element emitting the first blue light, the first phosphor layer including a first red phosphor that is excited by the first blue light to emit the first red light, and
the second light source includes a second blue light emitting element, a green light emitting element, and a second phosphor layer, the second blue light emitting element emitting second blue light, the green light emitting element emitting the green light, the second phosphor layer including a second red phosphor that is excited by both the second blue light and the green light to emit the second red light.

18. The display according to claim 13, wherein a half width of a maximum peak of the first red light is narrower than a half width of a maximum peak of the second red light.

19. The display according to claim 13, wherein
intensity distribution of the first red light with respect to a wavelength exhibits an emission line spectrum, and intensity distribution of the second red light with respect to a wavelength exhibits a continuous spectrum.

20. The light emitting device according to claim 11, wherein the second light source further includes a blue light component cut filter over the color conversion material that prevents a blue light component from passing through the blue light component cut filter.

* * * * *